(12) United States Patent
Kister

(10) Patent No.: US 7,046,021 B2
(45) Date of Patent: May 16, 2006

(54) DOUBLE ACTING SPRING PROBE

(75) Inventor: January Kister, Portola Valley, CA (US)

(73) Assignee: MicroProbe, Carlsbad, CA (US)

( * ) Notice: Subject to any disclaimer, the term of this patent is extended or adjusted under 35 U.S.C. 154(b) by 176 days.

(21) Appl. No.: 10/883,568

(22) Filed: Jun. 30, 2004

(65) Prior Publication Data
US 2006/0001437 A1 Jan. 5, 2006

(51) Int. Cl.
*G01R 324/754* (2006.01)

(52) U.S. Cl. .................................................... 324/754

(58) Field of Classification Search ................. 324/754, 324/757, 758, 690, 158.1, 696, 715, 724; 438/6, 14
See application file for complete search history.

(56) References Cited
U.S. PATENT DOCUMENTS 5,576,631 A * 11/1996 Stowers et al. ............. 324/761
5,936,421 A * 8/1999 Stowers et al. ............. 324/761

* cited by examiner

Primary Examiner—David Zarneke
Assistant Examiner—Trung Q. Nguyen
(74) Attorney, Agent, or Firm—Lumen Intellectual Property Services, Inc.

(57) ABSTRACT

A probe for test connecting an apparatus contact of a probe apparatus with a test contact of a tested electronic device along a contacting axis has a top structure, a bottom structure a spring member and a guide. The guide may be an outer guide face of the spring member or be part of the bottom or top structure in the form of a circumferential recess or a snap finger. The probe may be guided either slide ably in a rigid carrier structure and/or via its circumferential recess in one or two flexible membranes snapped on a rigid support frame. The probes may be simultaneously fabricated in large numbers by micro fabrication techniques with a fixed fabrication pitch and assembled in a probe apparatus with a probe pitch independently of the fabrication pitch.

45 Claims, 7 Drawing Sheets

DOUBLE ACTING SPRING PROBE

FIELD OF INVENTION

The present invention relates to testing interconnectors. In particular, the present invention relates to a testing probes with integrated spring member centrally held in a template in an individually replaceable fashion.

BACKGROUND OF INVENTION

With the advancement of micro fabrication techniques, probes for testing electronic circuitry may be increasingly mass fabricated at ever decreasing scale and increasing complexity. In an exemplary multilayer deposition process, a large number of microstructures are simultaneously grown on a substrate by the use of multiple masks and sacrificial fill structures to generate multistep structures substantially free of shape constraints. In the field of probe apparatus fabrication, this multilayer deposition process is used at the time of this invention, to fabricate the probes of a probe apparatus simultaneously on the substrate with a spacing that corresponds to the operational pitch of the finally assembled probes. Unfortunately, probe apparatus are highly individualized devices with many differing pitches of the assembled probes, which have to comply with the particularities of the tested circuitry and/or tested devices. To the contrary, the multilayer deposition process is very cost intensive due to the large number of deposition processes that need to be individually prepared and require also a large number of expensive masks. Therefore, there exists a need for probe designs and probe assembly techniques that utilize the free shaping capabilities of multilayer deposition processes without limitation of the affiliated fabrication spacing constrain. The present invention addresses this need.

SUMMARY

A probe for test connecting an apparatus contact of a probe apparatus with a test contact of a tested electronic device along a contacting axis has a top structure, a bottom structure a spring member and a guide. The guide may be an outer guide face of the spring member. The guide may also be part of the bottom or top structure in the form of a circumferential recess or a snap finger.

The snap finger may be arranged with respect to the contacting axis and extend substantially parallel to the contacting axis. The snap fingers may have snap hooks for snapping in at a rigid assembly hole of a rigid carrier structure for a releasable positioning together with other probes in a rigid carrier structure. The probe may be guided via its circumferential recess in a carrier structure in the configuration of a flexible membrane snapped on a rigid support frame. Flexible membrane and rigid carrier structure may be employed together.

The probes are assembled with their carrier structure(s) together with a space transformer that provides the apparatus contacts adjacent the top structure. The space transformer is in a plate spacing to the top of the top carrier structure that is larger than the top structure height such that the carrier structure may be assembled together with a number of probes and the space transformer substantially without deflection of the carrier structure and such that the top structures of the probes are brought into contact with the apparatus contacts during operational contact of the bottom structures with the test contacts.

The probes may be simultaneously fabricated in large numbers by micro fabrication techniques with a fixed fabrication pitch and assembled in a probe apparatus with a probe pitch independently of the fabrication pitch.

DETAILED DESCRIPTION

Figure 1:
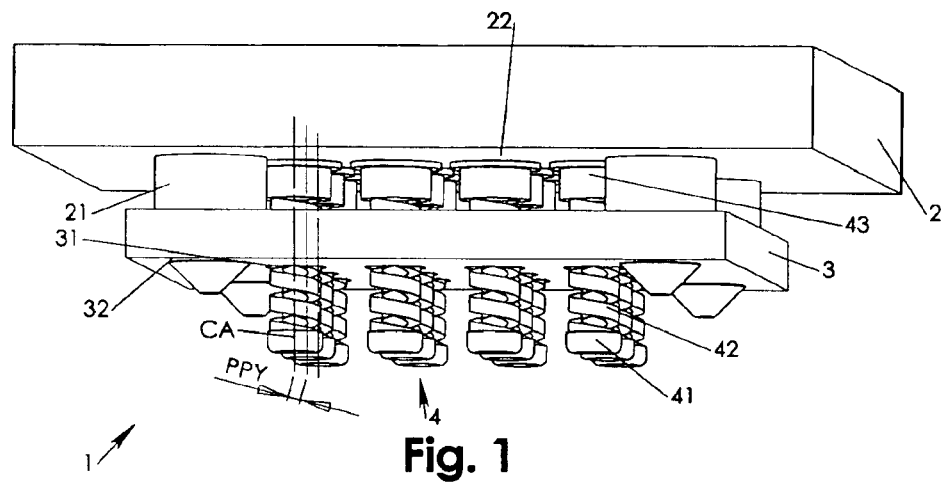
FIG. 1 is a first perspective view of a partial probe apparatus according to a first embodiment of the invention.
Figure 2:
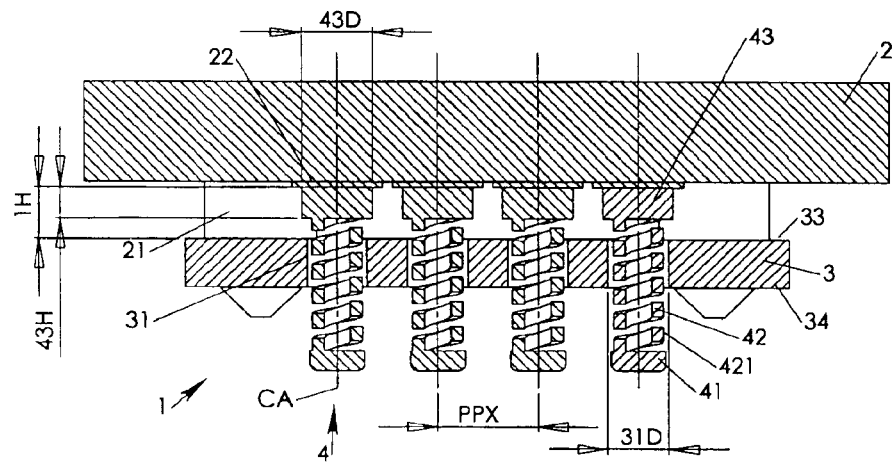
FIG. 2 is a frontal cut view of the partial probe apparatus of FIG. 1.

As in FIGS. 1, 2, a probe apparatus 1 according to a first embodiment may include a probe assembly having a number of probes 4 assembled with a probe pitch PPX and PPY in corresponding assembly holes 31 of a rigid carrier structure 3 preferably made of ceramic. The probe 4 has a top structure 43 for conductively operation contacting along a contacting axis CA a corresponding apparatus contact 22 of a circuit board 2, a bottom structure 41 for conductively test contacting a well known test contact and a spring member 42 interposed in between the top structure 43 and the bottom structure 41. The carrier structure 3 is substantially planar and extends preferably perpendicular with respect to the contacting axes CA. The contacting axes CA are preferably parallel to each other.

The spring member 42 conductively connects the structures 41 and 43. The spring member 42 has an outer guide face 421 with which the probe 4 is guided within a corresponding guide hole 31. The top structure 43 has a diameter 43D that is larger than assembly hole diameter 31D such that the top structure 43 is sandwiched between the carrier structure top 33 and the apparatus contacts 22. Alignment features 21 of the circuit board 2 snuggly fit in alignment holes 32 of the rigid carrier structure 3 for a precise positioning of the probe assembly within the probe apparatus 1.

A top structure height 43H is smaller than a plate spacing 1H between the apparatus contacts 22 and the carrier structure top 33 such that the carrier structure 3 may be assembled together with a number of probes 4 and the circuit board 2 substantially without deflection of the carrier structure 3 and such that the top structures 43 are brought into contact with the apparatus contacts 22 during operational contact of the bottom structures 41 with the test contacts.

Operational contact is established when a test contact is forced against the bottom structure 41 forcing the probe 4 along its contacting axis CA towards a respective apparatus contact 22 until contact is established between top structure 43 and assembly contact 22.

The spring member 22 may be a coil spring or any other spring structure fitting in close proximity around the contacting axis CA and providing an outer guiding face 421 suitable for slide ably interacting with the rigid assembly hole 31 as may be well appreciated by anyone skilled in the art. Two or more coil springs may be interweaved around the contacting axis CA.

In the first embodiment, the probes 4 are prevented from falling out of the fully assembled probe apparatus 1 irrespective of the probe apparatus' 1 orientation. To provide additionally simplified handling of the probe assembly alone without risk of inadvertent falling out of individual probes 4, second and third embodiment may be alternately utilized where probes 4, 4F are held in assembly position within the probe assembly alone. This may be advantageous for eventual maintenance work during which both the probes 4, 4F need to be accessed from top and bottom.

Figure 3:
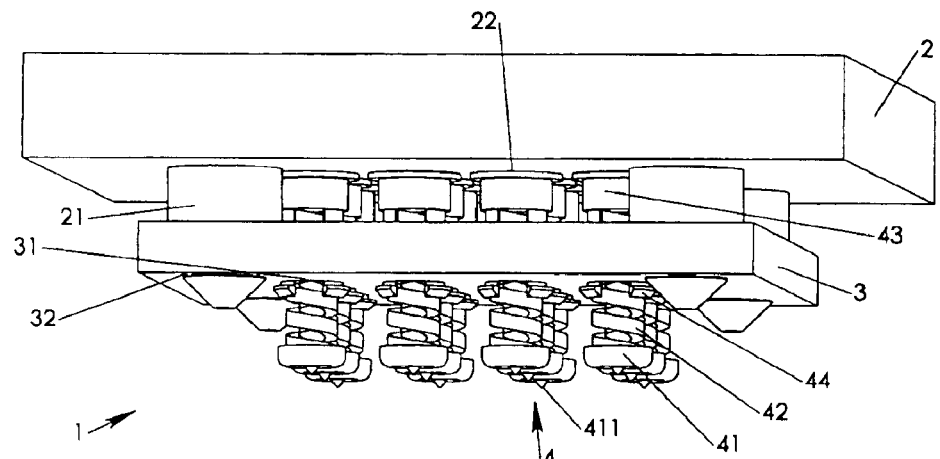
FIG. 3 is the first perspective view of a partial probe apparatus according to a second embodiment of the invention.
Figure 4:
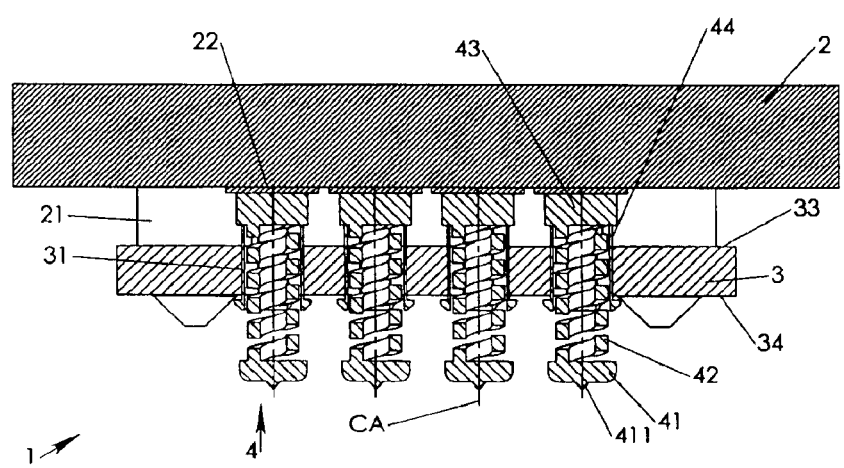
FIG. 4 is a frontal cut view of the partial probe apparatus of FIG. 3.
Figure 7:
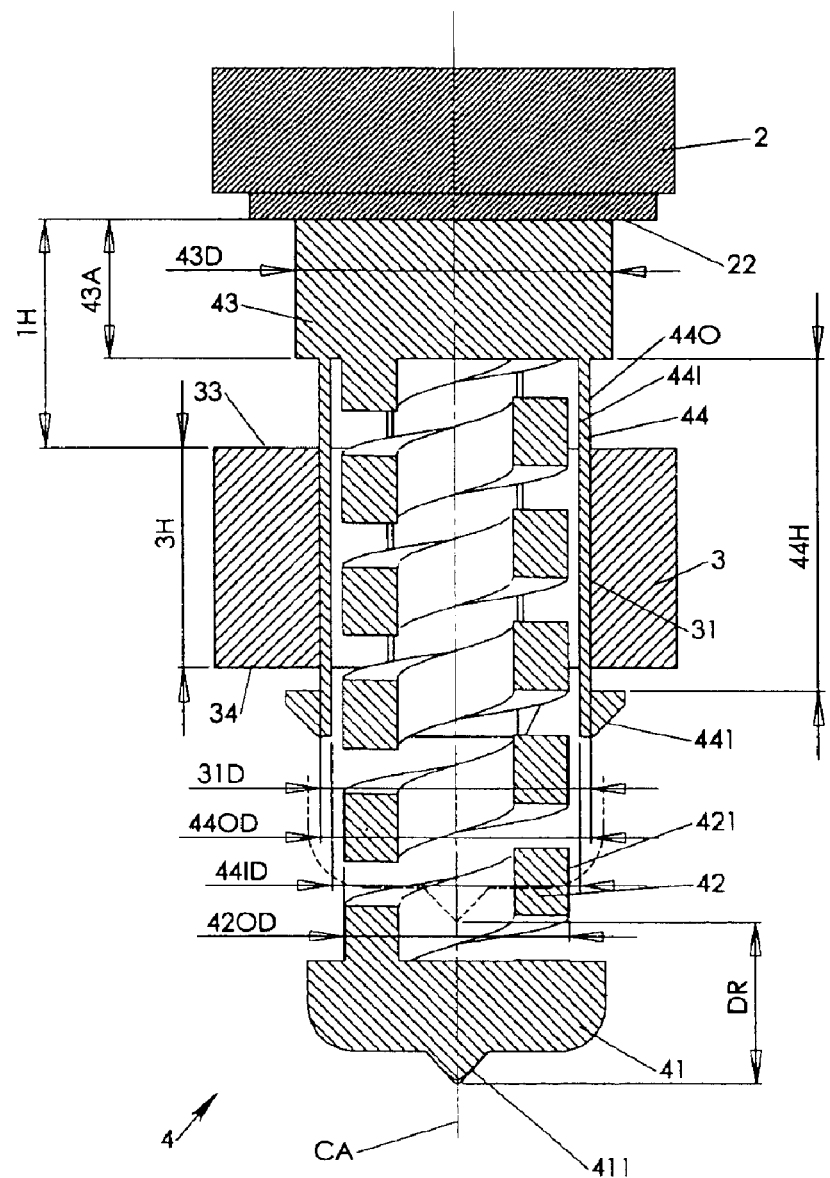
FIG. 7 is a detailed frontal cut view of a single assembled probe of the second embodiment.

As in FIGS. 3, 4, 7, a probe apparatus 1 features probes 4 of a second embodiment that have a number of snap fingers 44 acting as guides between the probe 4 and the rigid assembly hole 31 and also provide guidance for the spring member 42. The snap fingers 44 have snap hooks 441 at their free end for releasable snapping in the rigid carrier structure 3. The snap fingers 44 may be concentrically arrayed with respect to the contacting axis CA having inner and outer guide faces 44I, 44O substantially concentric to their respective other. The outer guide faces 44O and/or the inner guide faces 44I may be cylindrical. An outer guide face diameter 44OD may be slightly smaller than the assembly hole diameter 31D and a finger length 44H may be larger than the carrier structure thickness 3H together with the difference of top structure height 43H and plate spacing 1H such that operational contacting may be established before contacting of the snap hooks 441 with the carrier structure bottom 34. An inner guide face diameter 44ID is sufficiently larger than a spring guide face diameter 42OD such that the spring member 42 may freely deflect inside the snap fingers 44.

The snap fingers 44 may be combined with the top structure 43 as shown in the FIGS. 3, 4, 7 or with the bottom structure 41, in which case the finger length 41 is larger than the rigid carrier structure thickness 3H together with the operational deflection range DR. Deflection range DR is the maximum deflection of the assembled probe 4 during operation of the probe apparatus 1.

Figure 5:
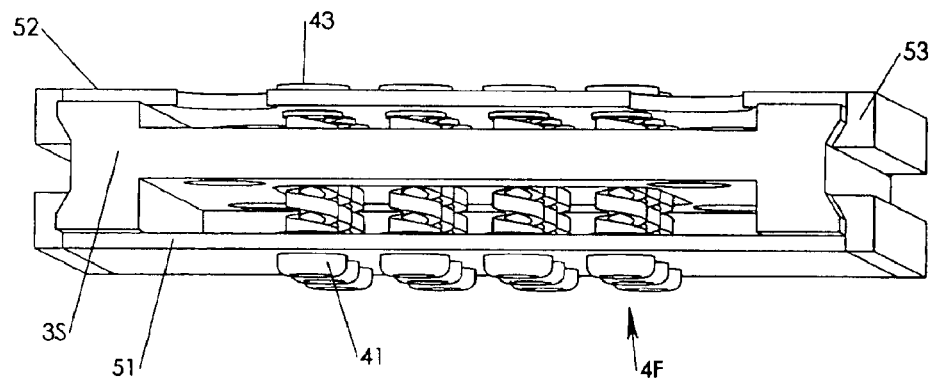
FIG. 5 is the first perspective view of a probe assembly according to a third embodiment of the invention.
Figure 6:
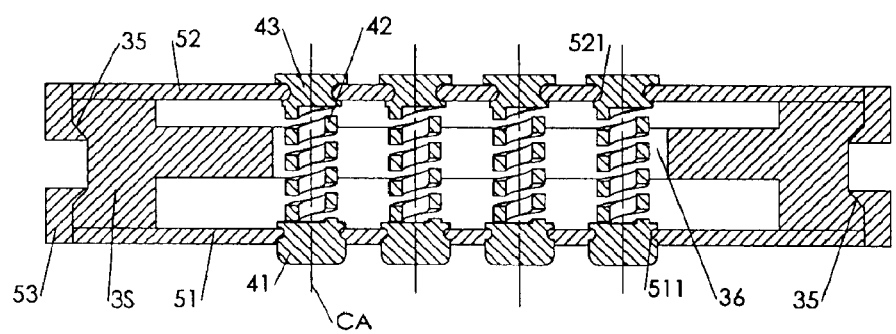
FIG. 6 is a frontal cut view of the probe assembly of FIG. 5.
Figure 11:
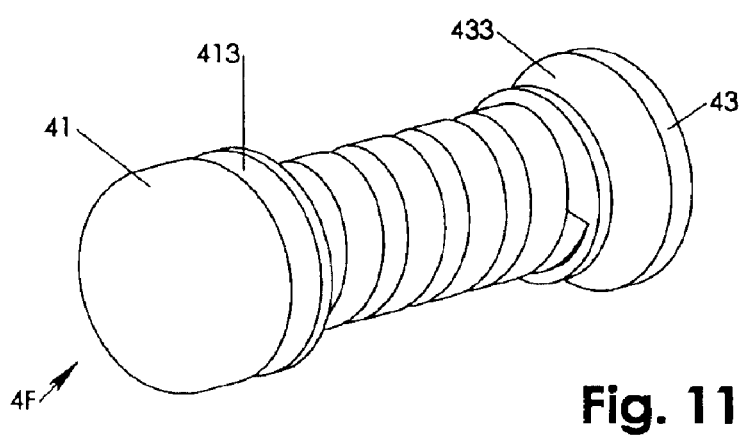
FIG. 11 is the second perspective view of the probe of the third embodiment.

As in FIGS. 5, 6, 11, a probe assembly of a third embodiment includes alternately or combined flexible bottom membrane 51 and/or flexible top membrane 52 that guide with their respective bottom and top membrane assembly holes 511, 521 the probes 4F via respective first and second circumferential recesses 433 and 413. In case, both membranes 51, 52 are employed together, full guidance of the probes 4F along their contacting axes CA is provided by the flexibility of the membrane. The membranes 51, 52 may be combined with a peripheral snap frame 53 and snapped on a rigid snap shoulder 35 of a rigid support frame 3S. The membranes 51, 52 may be made of well known Polyimide. The rigid support frame 3S may be configured similar to the rigid carrier structure 3. In case of both employed membranes 51, 52 the rigid support frame 3S may feature an assembly cavity 36 surrounding the probes 4F.

In case of a single membrane 51 or 52, the rigid support frame 3S may also feature assembly holes 31. Probes 4F may be guided additionally within the probe assembly either by spring guide faces 421 or outer snap finger guide faces 44O as described under first and second embodiments. Particular advantageous is the bottom membrane 52 for sealing the remainder of the probe apparatus 1 against eventual debris from the operational contacting of the bottom structures 41 with the test contacts.

Figure 8:
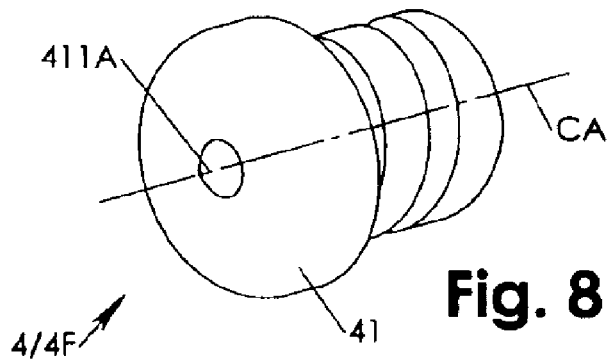
FIGS. 8–10 are partial second perspective views of various exemplary configurations of the bottom structure of the probe of the three embodiments.
Figure 9:
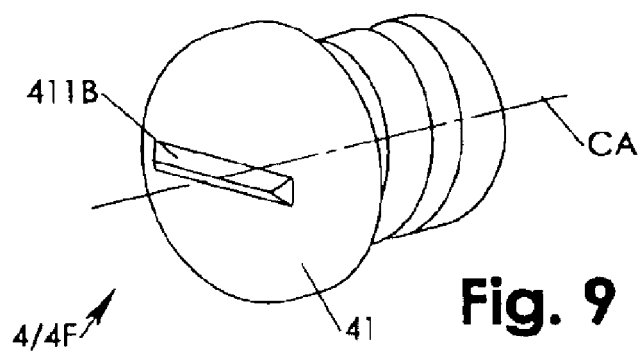
Figure 10:
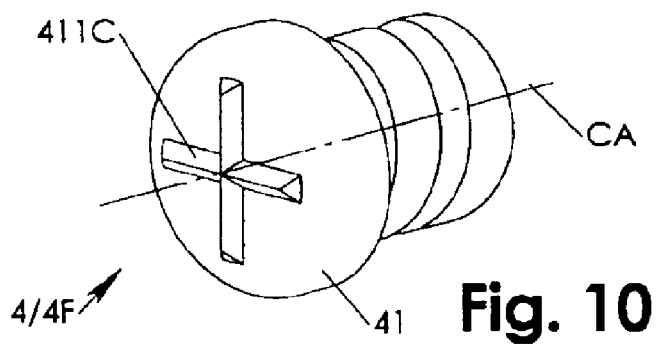

As in FIGS. 8–10, Probes 4, 4F may feature numerous contacting features 411 such as a pointed tip 411A, a wedge 411B or a cross wedge 411C. The contacting features 411 may be placed on the bottom structure 41 symmetrically with respect to the contacting axis CA. The pointed tip 411A may be employed alone or in a number circumferentially arrayed with respect to the contacting axis CA.

Figure 12:
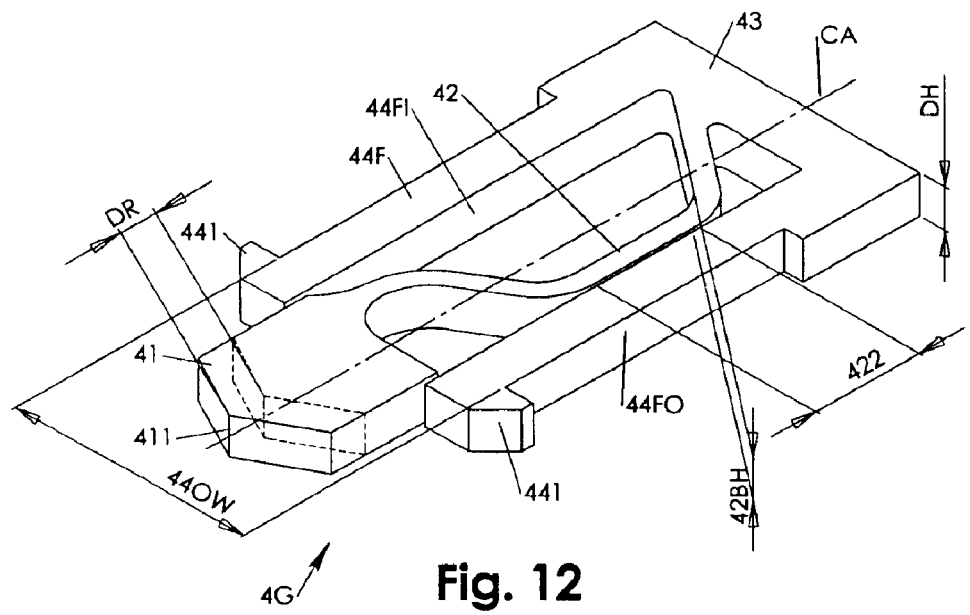
FIG. 12 is a third perspective view of a probe according to a fourth embodiment.
Figure 13:
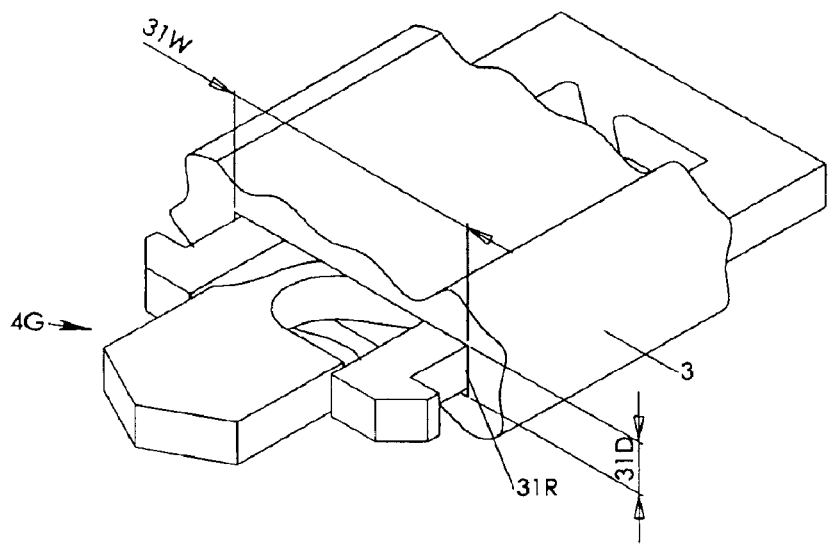
FIG. 13 is the third perspective view of the probe of FIG. 12 assembled in a correspondingly shaped assembly hole of a rigid carrier structure.

As in FIGS. 12 and 13, a probe 4G of a fourth embodiment may be fabricated as a continuous profile with a profile height DH. In the first, second and third embodiment, the probes 4, 4F may be fabricated by layered fabrication processes in direction parallel to the contacting axis CA. In the fourth embodiment to the contrary, the probe 4G may be fabricated by a layered fabrication process in direction perpendicular to the contacting axis CA. In that fashion, only a single fabrication layer may be employed for fabricating a complete probe 4G.

In the fourth embodiment, the spring member 42B is configured as a buckling beam preferably with a buckling orientation substantially in plane with the two snap fingers 44F. The buckling beam 42B has a buckling beam height 42BH preferably equal the profile height DH and slightly smaller than a hole width 31H of a rectangular rigid assembly hole 31R such that the buckling beam 42B is supporting itself against the assembly hole 31R in direction perpendicular to the buckling orientation. In addition, the buckling beam 42B may be configured for supporting itself in buckling orientation against at least one inner snap finger guide face 44FI along at least one support interface 422 shaped for a snuggle contacting with said snap finger guide face 44FI during at least a portion of the probe's 4G operational deflection range DR. The rectangular assembly hole 31R has a hole length 31W that corresponds to the distance 44OW between the outer snap finger guide faces 44FO. The bottom structure 41 is guided by the inner snap finger guide faces 44FI.

The dimensions of all snap hooks 441 are selected in conjunction with other affiliated dimensions of assembly holes 31, 31R and probes 4, 4G for a maximum deflection of the snap fingers 44, 44F during insertion into the assembly hole 31, 31R unimpeded by adjacent probe structures or members as may be well appreciated by anyone skilled in the art. The probes 4, 4F may also be permanently combined with the apparatus contacts 22 by well known reflow techniques. The probes 4, 4F may be monolithically fabricated or may be made of materials suitable to accomplish their particular task. Nickel Cobalt plated with Gold is an example of suitable metal combination.

Accordingly, the scope of the invention described in the specification above is set forth by the following claims and their legal equivalent.

What is claimed is:

1. A probe for test connecting an apparatus contact with a test contact along a contacting axis, said probe comprising:
   a. a top structure for conductively operation contacting said apparatus contact;
   b. a bottom structure for conductively test contacting said test contact;
   c. a spring member interposed in between said top structure and said bottom structure, said spring member conductively connecting said top structure with said bottom structure;
d. a guide substantially concentrically arrayed with respect to said contacting axis and combined with at least one of said top structure, said bottom structure and said spring member such that at least one other of said top structure, said bottom structure and said spring member are guided along said contacting axis.

2. The probe of claim 1, wherein said guide includes a number of snap fingers extending substantially parallel to said contacting axis, at least one of said snap fingers having a snap hook at its free end for releasable snapping in a rigid carrier structure extending substantially perpendicular to said contacting axis.

3. The probe of claim 2, wherein each of said snap fingers has a substantially cylindrical inner guide face co radial with an inner guide face of an other of said snap fingers.

4. The probe of claim 2, wherein each of said snap fingers has an outer guide face co radial with an other guide face of an other of said snap fingers.

5. The probe of claim 4, wherein said outer guide face is cylindrical.

6. The probe of claim 4, wherein said inner guide face is cylindrical.

7. The probe of claim 1, wherein said spring member is a coil spring.

8. The probe of claim 7, wherein at least two of said coil spring are interweaved around said contacting axis.

9. The probe of claim 1, wherein at least one of said top structure and said bottom structure is combined with said guide, wherein at least one other of said top structure and said bottom structure is guided by said guide and wherein said spring member is a buckling beam.

10. The probe of claim 9, wherein said guide includes two snap fingers positioned oppositely said contacting axis and wherein said buckling beam has a buckling orientation substantially in plane with said two snap fingers.

11. The probe of claim 10, wherein said buckling beam is configured for supporting itself in said buckling orientation against at least one inner snap finger guide face along at least one support interface shaped for a snuggle contact with said inner snap finger guide face during at least a portion of an operational deflection range.

12. The probe of claim 1, wherein said guide is a circumferential recess in at least one of said top structure and said bottom structure.

13. The probe of claim 1, wherein said bottom structure comprises a contacting feature.

14. The probe of claim 13, wherein said contacting feature is a pointed tip.

15. The probe of claim 13, wherein said contacting feature is a wedge.

16. The probe of claim 13, wherein said contacting feature is a cross wedge.

17. A probe assembly for test connecting a number of apparatus contacts with a number of test contacts along a number of contacting axes, said probe assembly comprising:
a. a planar carrier structure extending substantially perpendicular to said contacting axes, said planar carrier structure providing a number of assembly holes arrayed in correspondence with said contacting axes;
b. a number of probes each having:
I. a top structure for conductively operation contacting said apparatus contact;
II. a bottom structure for conductively test contacting said test contact;
III. a spring member interposed in between said top structure and said bottom structure, said spring member conductively connecting said top structure with said bottom structure;
IV. a guide substantially concentrically arrayed with respect to said contacting axis and combined with at least one of said top structure, said bottom structure and said spring member such that at least one other of said top structure, said bottom structure and said spring member are guided along said contacting axis;
wherein said guide is configured for fitting in one of said assembly holes.

18. The probe assembly of claim 17, wherein said guide includes a number of snap fingers extending substantially parallel to said contacting axis, at least one of said snap fingers having a snap hook at its free end for releasable snapping in said carrier structure of a rigid configuration.

19. The probe assembly of claim 18, wherein said snap finger has a finger length about equal a thickness of said carrier structure such that a corresponding of said probes is fixed while said snap finger is snapped in a corresponding of said assembly holes.

20. The probe assembly of claim 18, wherein said snap finger has a finger length substantially longer than a thickness of said carrier structure such that a corresponding of said probes is radially fixed and axially slidable for about the difference between said thickness and said finger length while said snap finger is snapped in a corresponding of said assembly holes.

21. The probe assembly of claim 18, wherein each of said snap fingers has an outer guide face co radial with an other guide face of an other of said snap fingers.

22. The probe assembly of claim 21, wherein one of said assembly holes is circular and a corresponding one of said outer guide faces is cylindrical.

23. The probe assembly of claim 18, wherein each of said snap fingers has a substantially cylindrical inner guide face co radial with an inner guide face of an other of said snap fingers.

24. The probe assembly of claim 23, wherein said inner guide face is cylindrical.

25. The probe assembly of claim 17, wherein said spring member is a coil spring.

26. The probe assembly of claim 25, wherein at least two of said coil spring are interweaved around said contacting axis.

27. The probe assembly of claim 17, wherein at least one of said top structure and said bottom structure is combined with said guide, wherein at least one other of said top structure and said bottom structure is guided by said guide and wherein said spring member is a buckling beam.

28. The probe assembly of claim 27, wherein said guide includes two snap fingers positioned oppositely said contacting axis and wherein said buckling beam has a buckling orientation substantially in plane with said two snap fingers.

29. The probe assembly of claim 28, wherein said buckling beam is configured for supporting itself in said buckling orientation against at least one inner snap finger guide face along at least one support interface shaped for a snug contact with said inner snap finger guide face during at least a portion of an operational deflection range.

30. The probe assembly of claim 28, wherein a corresponding of said assembly holes has a rectangular cross section having a length corresponding to a distance between outer guide faces of each of said snap fingers and having a width corresponding to a height of said buckling beam such that said buckling beam is guided along said assembly hole in direction perpendicular to said buckling orientation.

31. The probe assembly of claim 17, wherein said guide is a circumferential recess in at least one of said top structure and said bottom structure and wherein said carrier structure is a flexible membrane.

32. The probe assembly of claim 31, wherein said flexible membrane is held by a peripheral snap frame.

33. The probe assembly of claim 32, wherein said carrier structure is connected via said peripheral snap frame to a rigid support frame.

34. The probe assembly of claim 31, wherein said guide consist of a first and a second of said circumferential recesses, said first circumferential recess being part of said top structure and said second circumferential recess being part of said bottom structure and wherein a first of said flexible membrane is snapped in said first circumferential recess and wherein a second flexible membrane is snapped in said second circumferential recess, said first membrane being in an offset to said second membrane in a direction along said contacting axes.

35. The probe assembly of claim 31, wherein said flexible membrane is combined with a peripheral snap frame snapped on a rigid snap shoulder of said probe assembly.

36. The probe assembly of claim 31, wherein said guide consist of one of a first and a second of said circumferential recesses and a outer guide face of said spring member, said first circumferential recess being part of said top structure and said second circumferential recess being part of said bottom structure and wherein a first of said planar structure is rigid with said spring member being slidably guided with said outer guide face in a first of said assembly holes and wherein said flexible membrane is a second of said planar carrier structure snapped in said one of said first and said second circumferential recesses, said flexible membrane being in an offset to said rigid carrier structure in a direction along said contacting axes.

37. The probe assembly of claim 36, wherein said one circumferential recess is part of said bottom structure and said flexible membrane is below said rigid carrier structure substantially sealing said probe assembly against debris from a test contacting of said bottom structure with said test contacts.

38. The probe assembly of claim 17, wherein said bottom structure comprises a contacting feature.

39. The probe assembly of claim 38, wherein said contacting feature is a pointed tip.

40. The probe assembly of claim 38, wherein said contacting feature is a wedge.

41. The probe assembly of claim 38, wherein said contacting feature is a cross wedge.

42. The probe assembly of claim 17 being part of a probe apparatus.

43. The probe assembly of claim 42, wherein said number of apparatus contacts are on a bottom face of a circuit board, said apparatus contacts being in a plate spacing to a top face of said carrier structure, said plate spacing being larger than a height of said top structure such that said carrier structure may be assembled together with said number of probes and said circuit board substantially without deflection of said carrier structure and such that said top structures are brought into contact with said apparatus contacts during operational contact of said bottom structures with said test contacts.

44. The probe assembly of claim 17, wherein said top structure has a diameter larger than a diameter of a corresponding of said assembly holes such that said top structure is sandwiched in between said carrier structure and a corresponding of said apparatus contacts.

45. The probe assembly of claim 17, wherein said top structure is conductively combined with said apparatus contact.

* * * * *